United States Patent
Chi et al.

(10) Patent No.: US 9,749,962 B1
(45) Date of Patent: Aug. 29, 2017

(54) SYSTEM AND METHOD FOR CLOSED LOOP MULTIMODE RADIO SYSTEM SLEEP CLOCK FREQUENCY COMPENSATION

(71) Applicant: QUALCOMM INCORPORATED, San Diego, CA (US)

(72) Inventors: Xu Chi, San Diego, CA (US); Michael Naone Farias, San Diego, CA (US); Lalitaprasad Daita, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/190,177

(22) Filed: Jun. 23, 2016

(51) Int. Cl.
*H04W 52/02* (2009.01)
*G06F 1/32* (2006.01)
*H04W 88/06* (2009.01)

(52) U.S. Cl.
CPC ........ *H04W 52/0287* (2013.01); *G06F 1/324* (2013.01); *G06F 1/3206* (2013.01); *G06F 1/329* (2013.01); *H04W 88/06* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,995,820 | A | * | 11/1999 | Young .................. H04W 52/029 340/7.38 |
| 6,453,181 | B1 | * | 9/2002 | Challa ....................... H03L 1/00 455/343.4 |
| 7,039,438 | B2 | | 5/2006 | Khlat |
| 7,751,447 | B2 | | 7/2010 | Heinle et al. |
| 8,049,569 | B1 | | 11/2011 | Wright et al. |
| 8,341,443 | B2 | | 12/2012 | Voorwinden et al. |
| 9,013,305 | B2 | | 4/2015 | Sutton |
| 9,503,107 | B1 | * | 11/2016 | Kim ........................ H03L 7/103 |
| 2010/0019821 | A1 | * | 1/2010 | Priel ......................... G06F 1/04 327/291 |
| 2013/0278347 | A1 | * | 10/2013 | Li ............................ H03B 1/00 331/36 R |

* cited by examiner

*Primary Examiner* — Junpeng Chen
(74) *Attorney, Agent, or Firm* — Smith Tempel Blaha LLC

(57) ABSTRACT

Various embodiments of methods and systems for closed loop multimode sleep clock frequency compensation in a portable computing device are disclosed. An exemplary embodiment leverages a modem to determine a frequency shift on a sleep clock signal when a reference clock has transitioned into a power saving mode. Using the frequency shift calculation, a compensation capacitor may be adjusted to deliver a more optimum dummy load on the crystal oscillator when the reference clock is taken offline. The method may iterate through until the actual frequency shift of the sleep clock is within an acceptable tolerance relative to zero and, further, may also set a status bit to indicate that the sleep clock frequency is stable.

30 Claims, 7 Drawing Sheets

SYSTEM AND METHOD FOR CLOSED LOOP MULTIMODE RADIO SYSTEM SLEEP CLOCK FREQUENCY COMPENSATION

DESCRIPTION OF THE RELATED ART

Portable computing devices ("PCDs") commonly contain integrated circuits, or systems on a chip ("SoC"), that include numerous components designed to work together to deliver functionality to a user. For example, a SoC may contain any number of master components such as modems, displays, central processing units ("CPUs"), graphical processing units ("GPUs"), etc. that are used by application clients to process workloads.

As would be understood by one of ordinary skill in the art, master components in a SoC may operate according to multiple power modes depending on workload processing demands. When a given master component is actively processing a workload, for example, it may do so according to a "turbo mode" in which it is supplied power at a maximum voltage and frequency according to timing dictated by a low noise system reference clock. By contrast, when a given master component is not needed for processing a workload, for example, it may operate according to a "sleep mode" or "standby mode" such that it is supplied a relatively low power voltage and frequency according to timing dictated by a low power "always on" sleep clock.

In multimode SoCs, a shared mega-hertz crystal oscillator is used for generating both the low noise system reference clock and the low power "always on" sleep clock. Commonly, the sleep clock is used by systems and components in the SoC as a time reference to schedule tasks. Consequently, and as one of ordinary skill in the art would understand, frequency stability of the sleep clock is important as it dictates how much timing margin should be taken into account when scheduling tasks. That is, a stable sleep clock enables systems and components to be more aggressive with task scheduling, thereby promoting power and performance benefits.

Because the shared mega-hertz crystal oscillator is used for both the reference clock and the sleep clock, however, current systems and methods known in the art struggle to provide a sleep clock with a stable, consistent frequency output. When the reference clock is taken offline in response to the need for master component(s) to enter a low power mode, the sudden reduction in load on the crystal oscillator may cause a frequency shift that is felt by the sleep clock. Such a frequency shift may be problematic as it must be accounted for with timing margin, or timing cushion, when scheduling tasks to be completed by various components and systems around the SoC. Therefore there is a need in the art for a system and method that recognizes the reality of a frequency shift when a reference clock load is removed from a crystal oscillator and so compensates for the shift. More specifically, what is needed in the art is a system and method for a closed loop multimode radio system sleep clock frequency compensation.

SUMMARY OF THE DISCLOSURE

Various embodiments of methods and systems for closed loop multimode sleep clock frequency compensation in a portable computing device are disclosed. An exemplary embodiment sets a baseline assumption for a crystal oscillator frequency stability level defined by a range in parts per million relative to zero. For example, the crystal oscillator frequency stability level may be expected to be +/−5 ppm. Next, the exemplary method determines when a reference clock driven by the crystal oscillator has entered a power saving mode and begins to monitor a sleep clock frequency for a sleep clock driven by the crystal oscillator. Because the load associated with the reference clock has been removed from the crystal oscillator, the expectation is that there will be a frequency shift experienced by the "always on" sleep clock, albeit somewhat mitigated by the introduction of a dummy load on the crystal oscillator by a compensation capacitor. The method then determines that the reference clock has transitioned from the power saving mode to an active mode and, in response, is triggered to calculate the actual frequency shift associated with the sleep clock based on the difference between a measured sleep clock frequency and an expected sleep clock frequency. Using the frequency shift calculation, the compensation capacitor may be adjusted to deliver a more optimum dummy load on the crystal oscillator when the reference clock is taken offline. The method may iterate through until the actual frequency shift is within an acceptable tolerance relative to zero and, further, may also set a status bit to indicate that the sleep clock frequency is stable. Understanding that the frequency shift may vary over time due to temperature drifts, component aging, environmental conditions, etc., the method or state machine may continue to run on every sleep cycle, or from time to time on sleep cycles, to ensure that the actual frequency shift remains within an acceptable tolerance relative to zero.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

Figure 1:
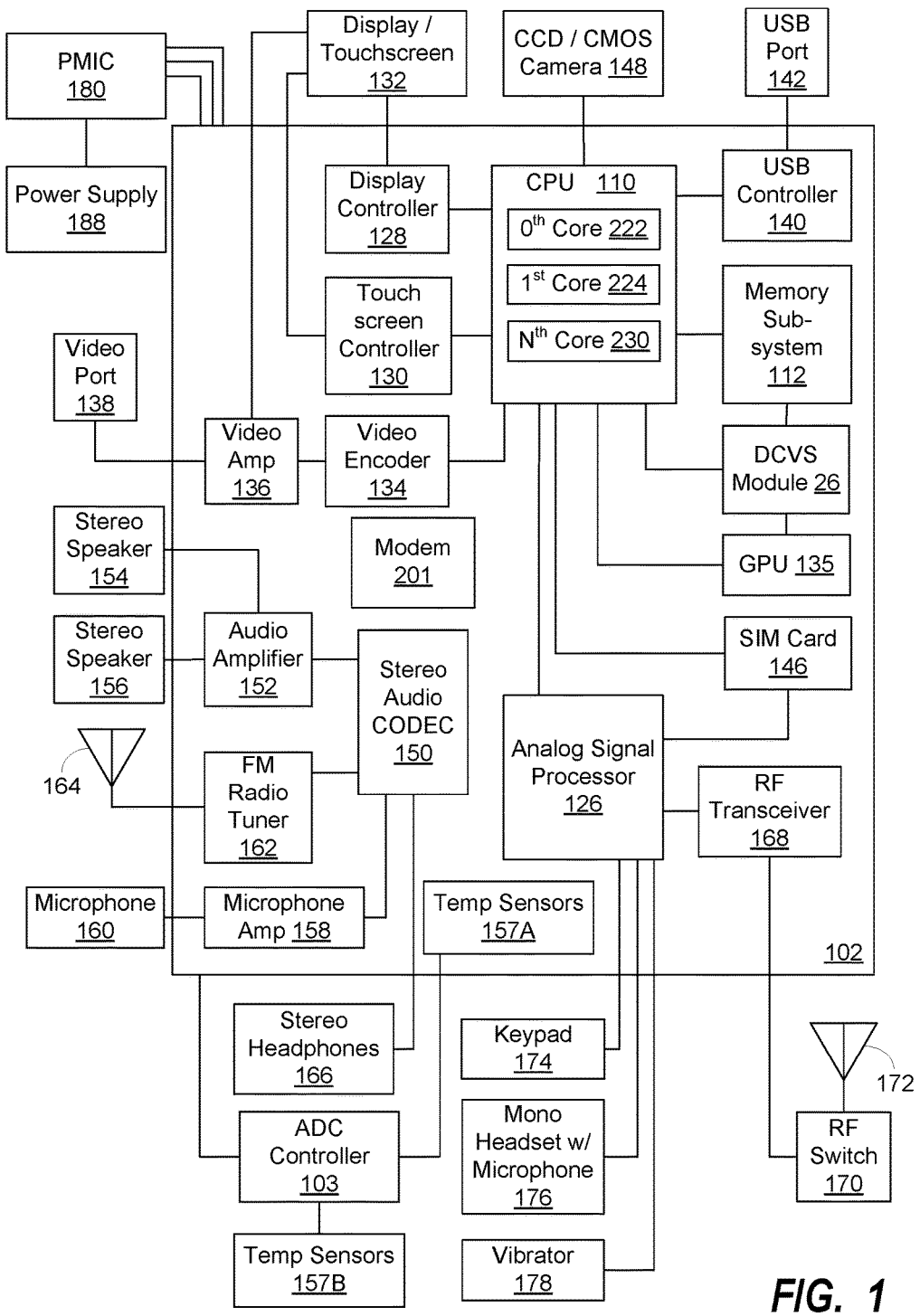
FIG. 1 is a functional block diagram illustrating an exemplary, non-limiting aspect of a portable computing device ("PCD") in the form of a wireless telephone for implementing closed loop multimode radio system sleep clock frequency compensation systems and methods.

The word "exemplary" is used herein to mean serving as an example, instance, or illustration. Any aspect described herein as "exemplary" is not necessarily to be construed as exclusive, preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

In this description, the terms "sleep clock" and "house keeping clock" are used interchangeably to refer to a low power clock used by components and systems within a SoC for task scheduling, as would be understood by one of ordinary skill in the art.

As used in this description, the terms "component," "database," "module," "system," "generator," "engine," "controller," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "central processing unit ("CPU")," "digital signal processor ("DSP")," "graphical processing unit ("GPU")," and "chip" are used interchangeably. Moreover, a CPU, DSP, GPU or a chip may be comprised of one or more distinct processing components generally referred to herein as "core(s)."

In this description, the terms "engine," "processing engine," "master processing engine," "master component," "data generator," "processing block" and the like are used to refer to any component within a system on a chip ("SoC") that generates transaction requests to closely coupled memory devices and/or to components of a memory subsystem via a bus. A master component relies on a high frequency, low noise reference clock, in conjunction with a dynamic frequency and voltage system module, to set its processing speed when in an active mode, such as a turbo mode. A master component may alternatively rely on a low frequency, low power sleep clock for scheduling workload processing and tasks when the master component is in a low power mode, such as a sleep mode or standby mode. As such, a master component may refer to, but is not limited to refer to, a CPU, DSP, GPU, modem, controller, display, camera, etc. A master component in the form of a modem may be leveraged by an embodiment of the solution to recognize a frequency shift magnitude in a sleep clock attributable to a reference clock going offline and use that information to adjust or tune a compensation capacitor.

In this description, the terms "resonator," "crystal oscillator" and "XO" are used interchangeably to refer to an piezoelectric resonator that relies on the mechanical resonance of a vibrating crystal of piezoelectric material to create an electrical signal with a precise frequency. Although the term "crystal oscillator" implies an oscillator system based on a quartz crystal, embodiments of the solution are not limited to use of quartz based oscillators. For example, it is envisioned that embodiments of the solution may comprise oscillators based polycrystalline ceramics. As would be understood by one of ordinary skill in the art of oscillators, the particular shape or cut of a piezoelectric material determines the frequency at which the material oscillates.

In this description, the term "portable computing device" ("PCD") is used to describe any device operating on a limited capacity power supply, such as a battery. Although battery operated PCDs have been in use for decades, technological advances in rechargeable batteries coupled with the advent of third generation ("3G") and fourth generation ("4G") wireless technology have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, a laptop computer with a wireless connection, among others.

As would be understood by one of ordinary skill in the art, a sleep clock is an "always on" system clock typically running in a kilo hertz range. In a low power communication system, a sleep clock is a critical infrastructure resource used by processing components, such as the modem, to maintain timing information and effective duty cycling of high power blocks. As such, a sleep clock with relatively high frequency stability may allow a system block within a SoC to schedule tasks more effectively and with less overhead due to timing uncertainty. For example, a sleep clock with +/−1 ppm frequency stability may allow system blocks to schedule tasks 10 seconds later than would otherwise be required if relying on a less stable sleep clock. Put simply, a stable sleep clock allows system blocks within the SoC the luxury of waking out of a sleep mode at the last possible instant, such as only ten microseconds ("10 μS") prior to a scheduled task, thereby avoiding unnecessary power consumption.

In some embodiments of the solution, the sleep clock may be derived from a dedicated tuning fork cut 32 KHz crystal oscillator, which consumes about 1 uW of power and maintains a stable frequency output when exposed to a predictable and stable ambient temperature. Notably, however, because exposure to fluctuations in thermal energy levels on the SoC may negatively impact the frequency stability of a tuning fork cut 32 KHz crystal oscillator, certain embodiments of the solution envision application in SoCs that include a higher frequency 19.2 MHz AT cut quartz based oscillator system (a relatively less temperature sensitive reference clock source that has a number of tradeoffs—typically about 200 uW power consumption in addition to frequency stability challenges during mode changes). Even so, it will be understood that embodiments of the solution are not limited to any particular type of oscillator system or its frequency output.

In a modern low cost, low power, multimode SoC, a shared mega-hertz crystal oscillator system may be used to generate both a low noise system reference clock as well as a low power "always on" sleep clock. Consequently, a crystal oscillator system typically has three main blocks: a high frequency reference clock block, a low frequency sleep clock block, and an XO block.

Because the sleep clock is always on, it is commonly used as a time reference for scheduling tasks. Consequently, frequency stability of the sleep clock dictates just how much timing margin the system has to accommodate when scheduling a task. As would be understood by one of ordinary skill in the art, a stable sleep clock frequency may allow more aggressive task scheduling, thereby leading to power and performance benefits.

When taken into a sleep mode, the high frequency reference clock goes offline to save power. Notably, with the high frequency reference block offline, the reduction in load causes a frequency shift on the crystal oscillator that is felt by the sleep clock. Left uncompensated, the sleep clock frequency shift may be around 10 ppm. To compensate for the frequency shift, open loop solutions switch in portions of a capacitor bank to generate a "dummy load" on the oscillator that takes the place of the offline reference clock. The amount of capacitance switch in may be predetermined from characterization efforts in the lab. Consequently, when switching in a predetermined capacitance load, the compensated frequency shift ultimately felt by the sleep clock is a function of the specific SoC process and corner. As such, in an open loop approach that switches in a capacitance load when the reference clock is taken offline, a net frequency shift to the sleep clock is expected when the crystal oscillator is transitioned between modes. The net frequency shift may be less than the uncompensated frequency shift, yet nonetheless still not optimal—the amount of net frequency shift is only as good as the predetermined guess on how much capacitance to switch in when the reference clock is taken offline. To further complicate matters, the effects of temperature on the crystal oscillator may cause the net frequency shift to fluctuate from one mode transition to the next as the ideal dummy capacitance load becomes a moving target unachievable by a predetermined capacitance load.

Advantageously, embodiments of the solution take a closed loop capacitance compensation approach by leveraging a modem feedback to the XO. Because a modem may be configured to determine a frequency shift on the sleep clock, a modem may be used by embodiments of the solution to recognize a net frequency shift experienced by a sleep clock due to a recent mode transition in the SoC from a sleep mode to an active mode. The information detected by the modem may be processed and fed back to the power management integrated circuit ("PMIC") for adjustment of the capacitance load setting switch in during a mode transition. Continuous application of the feedback and adjustment loop enables embodiments of the solution to "dial in" an optimum capacitance load setting for switching in place of a reference clock that is taken offline. In this way, embodiments of the solution enable a much more stable sleep clock frequency during mode change in the SoC, as well as allow for more aggressive XO power mode scaling between sleep and active modes (thereby saving power during sleep mode).

In an exemplary embodiment of the solution, a modem is utilized to monitor sleep clock frequency error and provide feedback to the PMIC for adjustment of a compensation capacitor. Notably, it is envisioned that the compensation capacitor, which generates a "dummy load" on the crystal oscillator when a reference clock block is taken offline according to a sleep mode, may be an adjustable or trimmable capacitor or, alternatively, may be a bank of capacitors any variable portion of which may be designated for generating the dummy capacitance load. The compensation capacitor cancels the frequency shift on the XO that would otherwise result from an active/sleep transition. By continuously monitoring the frequency shift and making adjustments to the compensation capacitor setting in view of the monitored shifts, embodiments of the solution may fine tune the dummy capacitance load to approach an optimal capacitance load that replaces the reference clock load and eliminates a frequency shift on the sleep clock.

As a nonlimiting example of the solution, a modem begins with an assumption of the XO frequency stability such as, for example, 5 ppm. During the first few sleep cycles, the modem seeks to determine which way the sleep frequency is shifting during sleep. With knowledge of the frequency shift magnitude and direction, the modem provides information to a capacitor adjustment module in the PMIC that, in turn, adjusts the XO sleep frequency compensation control register. In this way, the loop may continue until the modem has determined that, based on a last number of mode transition cycles, the deterministic XO sleep frequency shift has been tuned out. Once the frequency shift error has been tuned out, the modem may work to set a status bit in the modem (or resource power manager, "RPM") to indicate that the XO frequency has been optimized. With a tight tolerance of XO stability assumed, systems and components in the SoC relying on the sleep clock for task management and scheduling may leverage optimal power saving settings. Notably, although the modem is used for illustrative purposes in this disclosure, it is envisioned that in alternative embodiments a module other than the modem, or a module comprising the modem, may provide the calibration feedback loop to the compensation capacitor in the PMIC. As such, the scope of the disclosure is not limited to the use of a modem.

FIG. 1 is a functional block diagram illustrating an exemplary, non-limiting aspect of a portable computing device ("PCD") in the form of a wireless telephone for implementing closed loop multimode radio system sleep clock frequency compensation systems and methods. As shown, the PCD 100 includes an on-chip system 102 that includes a multi-core central processing unit ("CPU") 110 and an analog signal processor 126 that are coupled together. The CPU 110 may comprise a zeroth core 222, a first core 224, and an Nth core 230 as understood by one of ordinary skill in the art. Further, instead of a CPU 110, a digital signal processor ("DSP") may also be employed as understood by one of ordinary skill in the art.

As illustrated in FIG. 1, a display controller 128 and a touch screen controller 130 are coupled to the digital signal processor 110. A touch screen display 132 external to the on-chip system 102 is coupled to the display controller 128 and the touch screen controller 130. PCD 100 may further include a video encoder 134, e.g., a phase-alternating line ("PAL") encoder, a sequential couleur avec memoire ("SECAM") encoder, a national television system(s) committee ("NTSC") encoder or any other type of video encoder 134. The video encoder 134 is coupled to the multi-core CPU 110. A video amplifier 136 is coupled to the video encoder 134 and the touch screen display 132. A video port 138 is coupled to the video amplifier 136. A modem 201 may be comprised within IC 102 and operable to communicate with a capacitance adjustment module (not shown) in the PMIC 180 for closed loop multimode radio system sleep clock frequency compensation.

As depicted in FIG. 1, a universal serial bus ("USB") controller 140 is coupled to the CPU 110. Also, a USB port 142 is coupled to the USB controller 140. The memory subsystem 112, which may include a PoP and/or non-PoP memory, a mask ROM/Boot ROM, a boot OTP memory, an MMU, a DDR memory, and caches may also be coupled to the CPU 110 and/or include its own dedicated processor(s).

A subscriber identity module ("SIM") card 146 may also be coupled to the CPU 110. Further, as shown in FIG. 1, a digital camera 148 may be coupled to the CPU 110. In an exemplary aspect, the digital camera 148 is a charge-coupled device ("CCD") camera or a complementary metal-oxide semiconductor ("CMOS") camera.

As further illustrated in FIG. 1, a stereo audio CODEC 150 may be coupled to the analog signal processor 126. Moreover, an audio amplifier 152 may be coupled to the stereo audio CODEC 150. In an exemplary aspect, a first stereo speaker 154 and a second stereo speaker 156 are coupled to the audio amplifier 152. FIG. 1 shows that a microphone amplifier 158 may be also coupled to the stereo audio CODEC 150. Additionally, a microphone 160 may be coupled to the microphone amplifier 158. In a particular aspect, a frequency modulation ("FM") radio tuner 162 may be coupled to the stereo audio CODEC 150. Also, an FM antenna 164 is coupled to the FM radio tuner 162. Further, stereo headphones 166 may be coupled to the stereo audio CODEC 150.

FIG. 1 further indicates that a radio frequency ("RF") transceiver 168 may be coupled to the analog signal processor 126. An RF switch 170 may be coupled to the RF transceiver 168 and an RF antenna 172. Modem 201 may be communicatively coupled to RF transceiver 168. As shown in FIG. 1, a keypad 174 may be coupled to the analog signal processor 126. Also, a mono headset with a microphone 176 may be coupled to the analog signal processor 126. Further, a vibrator device 178 may be coupled to the analog signal processor 126. FIG. 1 also shows that a power supply 188, for example a battery, is coupled to the on-chip system 102 through a power management integrated circuit ("PMIC") 180 (more details regarding PMIC 180 illustrated in subsequent figures). In a particular aspect, the power supply 188 includes a rechargeable DC battery or a DC power supply that is derived from an alternating current ("AC") to DC transformer that is connected to an AC power source.

The CPU 110 may also be coupled to one or more internal, on-chip thermal sensors 157A as well as one or more external, off-chip thermal sensors 157B. The on-chip thermal sensors 157A may comprise one or more proportional to absolute temperature ("PTAT") temperature sensors that are based on vertical PNP structure and are usually dedicated to complementary metal oxide semiconductor ("CMOS") very large-scale integration ("VLSI") circuits. The off-chip thermal sensors 157B may comprise one or more thermistors. The thermal sensors 157 may produce a voltage drop that is converted to digital signals with an analog-to-digital converter ("ADC") controller (not shown). However, other types of thermal sensors 157 may be employed in a PCD 100.

The touch screen display 132, the video port 138, the USB port 142, the camera 148, the first stereo speaker 154, the second stereo speaker 156, the microphone 160, the FM antenna 164, the stereo headphones 166, the RF switch 170, the RF antenna 172, the keypad 174, the mono headset 176, the vibrator 178, thermal sensors 157B, the PMIC 180 and the power supply 188 are external to the on-chip system 102. It will be understood, however, that one or more of these devices depicted as external to the on-chip system 102 in the exemplary embodiment of a PCD 100 in FIG. 1 may reside on chip 102 in other exemplary embodiments.

In a particular aspect, one or more of the method steps described herein may be implemented by executable instructions and parameters stored in the memory subsystem 112 or as form the capacitance adjustment module 101 (see subsequent figures) and/or the XO system (see subsequent figures). Further, the memory subsystem 112, the CAM module 101, the modem 201 (or RPM 202) and/or the clocks 203, 204, the instructions stored therein, or a combination thereof may serve as a means for performing one or more of the method steps described herein.

Figure 2:
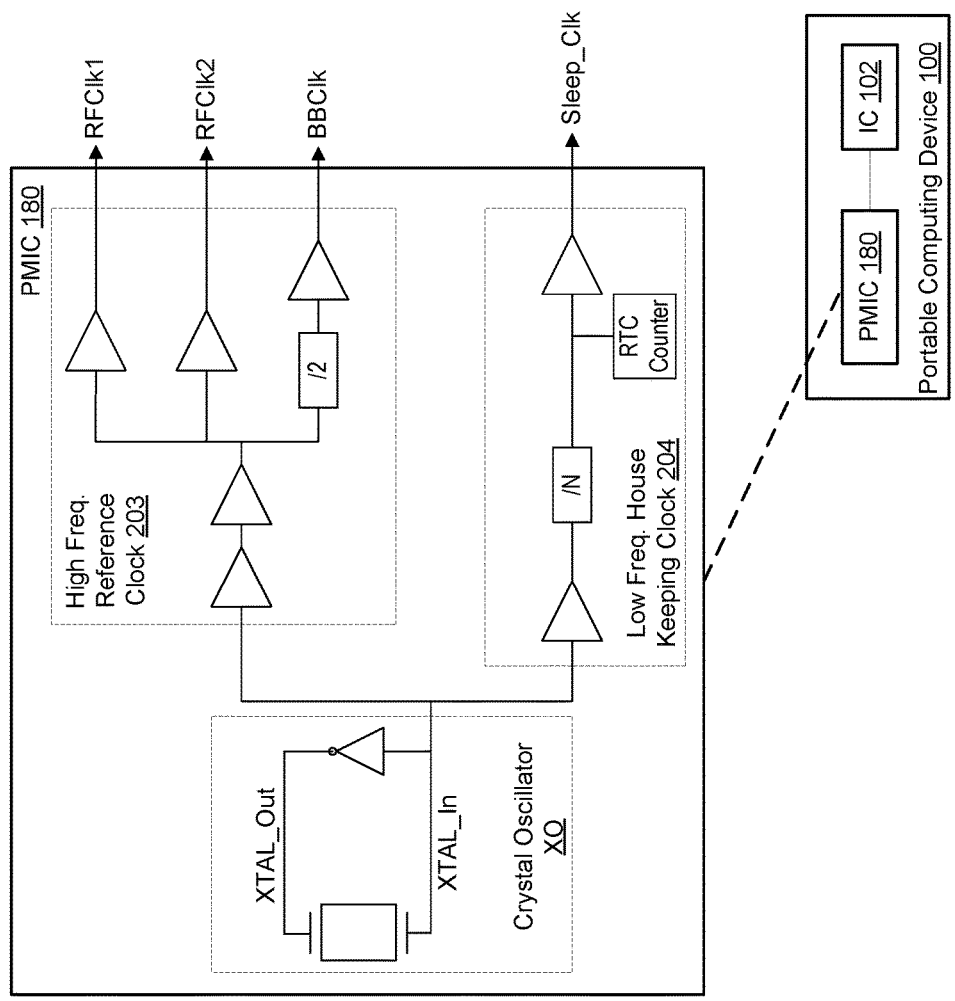
FIG. 2 is a diagram illustrating a multimode arrangement of a shared crystal oscillator driving a high frequency reference clock and a low frequency house keeping clock.

FIG. 2 is a diagram illustrating a multimode arrangement of a shared crystal oscillator XO driving a high frequency reference clock 203 and a low frequency house keeping clock 204. In the FIG. 2 illustration, the multimode arrangement is comprised within the PMIC 180. The crystal oscillator, generates a frequency signal that is used by both the high frequency reference clock 203 and the low frequency house keeping clock 204. As would be understood by one of ordinary skill in the art, the clocks 203, 204 are used by components and subsystems on the SoC 102 for workload processing and task scheduling. For example, components on SoC 102 that are in an active mode, such as a turbo mode, may rely on the reference clock 203 for setting processing speeds. If/when a component on the SoC 102 is taken into a standby or power saving mode, the component may then rely on the house keeping clock 204. Moreover, components and subsystems in SoC 102 may rely on the "always on" house keeping clock 204 for scheduling future workloads and tasks (reference clock 203 may not always be "on" as it may go offline when not needed so that it is in a power saving mode). As such, the frequency stability of the housekeeping clock 204, or any lack of stability, directly impacts the ability of processing components and subsystems in the SoC 102 to efficiently schedule workloads or tasks to minimize power consumption without negatively impacting quality of service to a user.

For example, when relying on a relatively unstable sleep clock, processing components and subsystems in the SoC 102 must take the frequency shift margin into account and schedule workloads or tasks much sooner than ideally required in order to ensure that quality of service does not suffer. With such in mind, one of ordinary skill in the art would recognize that a more accurate and consistent frequency generation from a house keeping clock regardless of mode transition in the SoC 102 enables components and subsystems relying on the clock to avoid having to "wake" and consume power any earlier than necessary.

Figure 3:
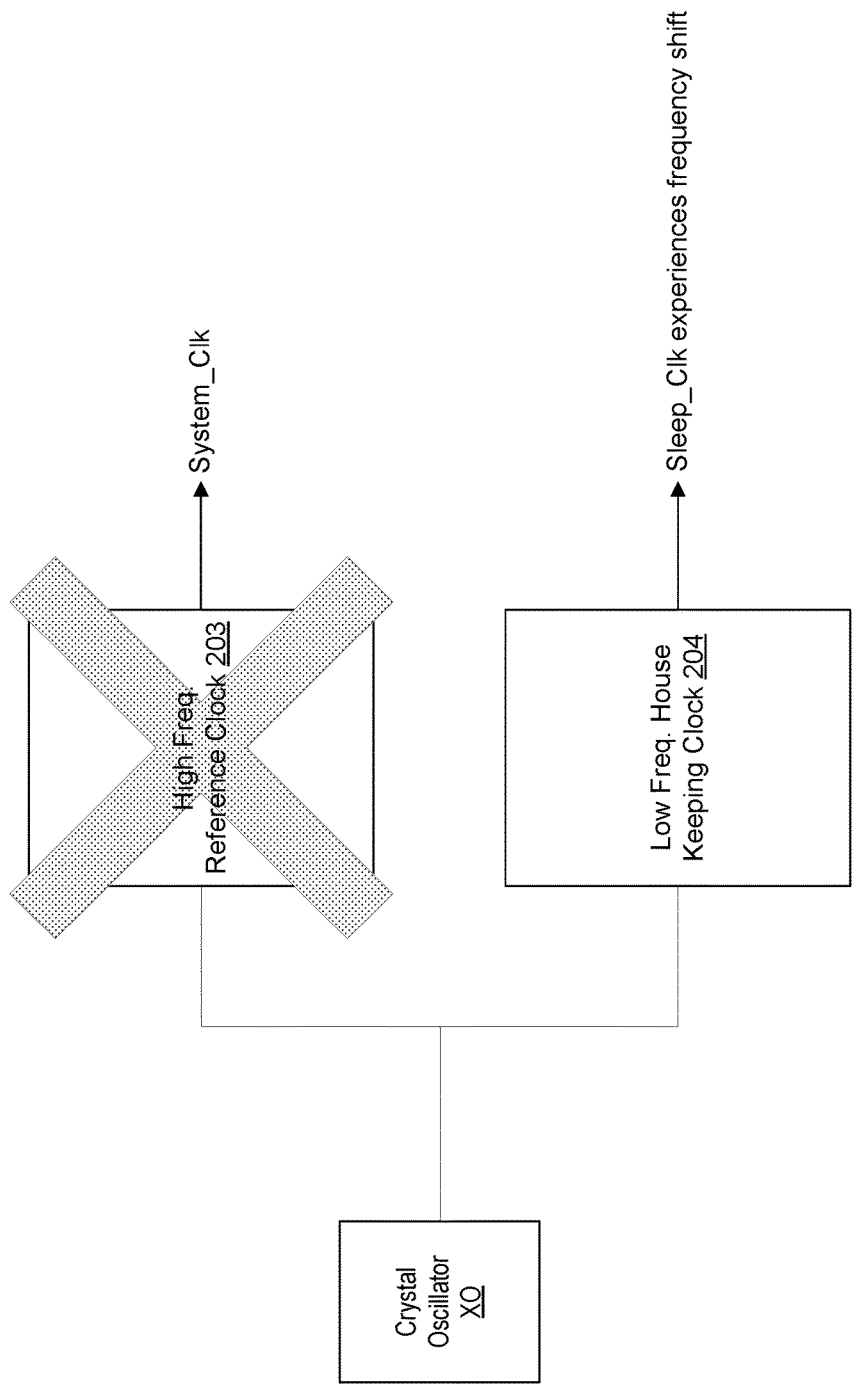
FIG. 3 is a functional block representation of the diagram of FIG. 2, illustrating a sleep mode that includes the high frequency reference clock in an offline state.

FIG. 3 is a functional block representation of the diagram of FIG. 2, illustrating the crystal oscillator system in a sleep mode that includes the high frequency reference clock in an offline state. As explained above, the XO generates a frequency signal that drives the high frequency reference clock 203 as well as the low frequency house keeping clock 204. The reference clock 203 may be "online" or "offline" depending on the power mode (e.g., turbo, nominal, standby, etc.). Whenever the reference clock 203 is not needed, it may be taken offline such that it is transitioned to a sleep mode or standby mode so that it doesn't consume power unnecessarily. Whenever the reference clock 203 is taken offline (as illustrated in FIG. 3), the frequency generated by the XO may undergo a shift as the reference clock load 203 is removed. As a result, the shifted frequency is supplied to the house keeping clock 204. With the frequency supplied to the house keeping clock 204 shifted, the accuracy and consistency of the clock signal supplied to components and subsystems in the SoC may suffer. Consequently, components and subsystems relying on the house keeping clock for task scheduling and other needs may have to recognize and protect against the frequency by scheduling tasks at less than optimal times.

Figure 4:
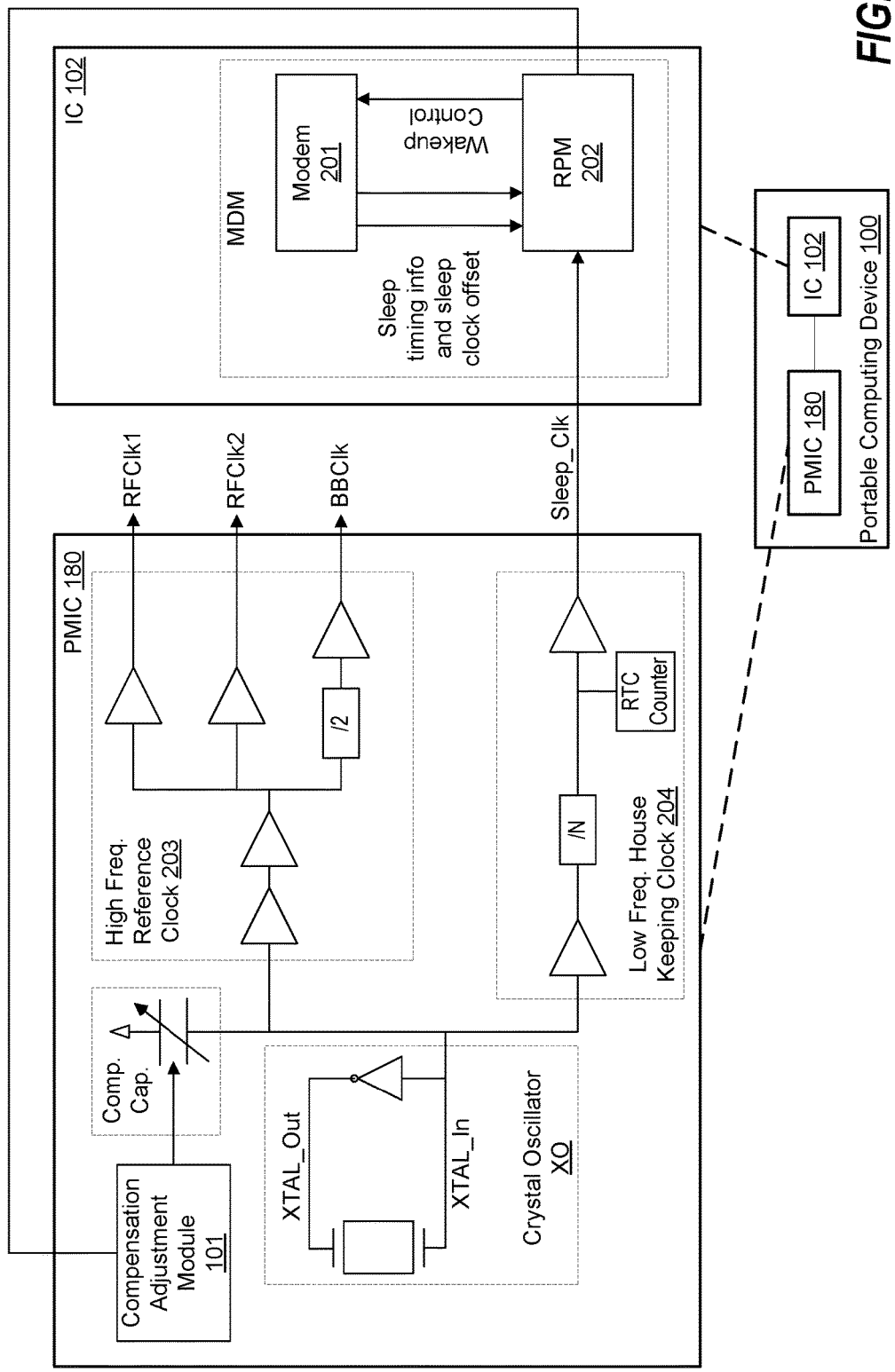
FIG. 4 is a diagram illustrating a multimode arrangement of a shared crystal oscillator driving a high frequency reference clock and a low frequency house keeping clock according to an embodiment of the solution.

FIG. 4 is a diagram illustrating a multimode arrangement of a shared crystal oscillator driving a high frequency reference clock 203 and a low frequency house keeping clock 204 according to an embodiment of the solution. Recognizing that the house keeping clock 204 may experience a frequency shift when the reference clock 203 is taken offline, embodiments of the solution seek to calculate the shift and leverage a closed loop calibration to adjust a compensation capacitor 209. The sleep clock signal is monitored by the modem 201 (and/or the resource power manager 202) to recognize a shift in its frequency.

When the reference clock 203 is taken offline, a compensation capacitor 209 is brought online simultaneously. The compensation capacitor provides a "dummy" capacitance load meant to replace the load of the reference clock 203. The goal in doing so is to minimize the frequency disruption on the XO that results from the load change. Notably, however, because the load of the reference clock 203 may differ from the dummy load generated by the compensation capacitor 209, embodiments of the solution provide a feedback loop to a capacitor adjustment module 101 configured to adjust or trim the capacitance setting of the compensation capacitor 209. Adjusting the capacitance setting of the compensation capacitor 209 may entail adjusting the physical attributes of a compensation capacitor 209 or, alternatively, may entail adjusting the number of online capacitors in a bank of capacitors which collectively define a compensation capacitor 209.

To generate the feedback loop data, the modem 201 may recognize when the reference clock 203 is taken offline. When the modem 201 subsequently recognizes a mode transition to bring the reference clock back online, it compares the sleep clock timing to an expected timing. The delta of the timing (actual versus expected) is provided to the capacitor adjustment module 101 which, in turn, adjusts the compensation capacitor 209. Notably, if the compensation capacitor 209 is set to generate a capacitance load that is commensurate with the load generated by the reference clock 203, then the delta between the actual sleep clock frequency and the expected sleep clock frequency would be at, or near, zero. Moreover, if the compensation capacitor 209 setting is less than, or more than, the load associated with the reference clock when active, then the sleep clock frequency will be either above or below an ideal setting by some number of parts per million ("ppm"). Advantageously, embodiments of the solution use multiple iterations of mode transitions to fine tune and "dial in" the compensation capacitor 209 setting such that the sleep clock frequency is reliable and consistent whether the reference clock is online or offline.

Figure 5:
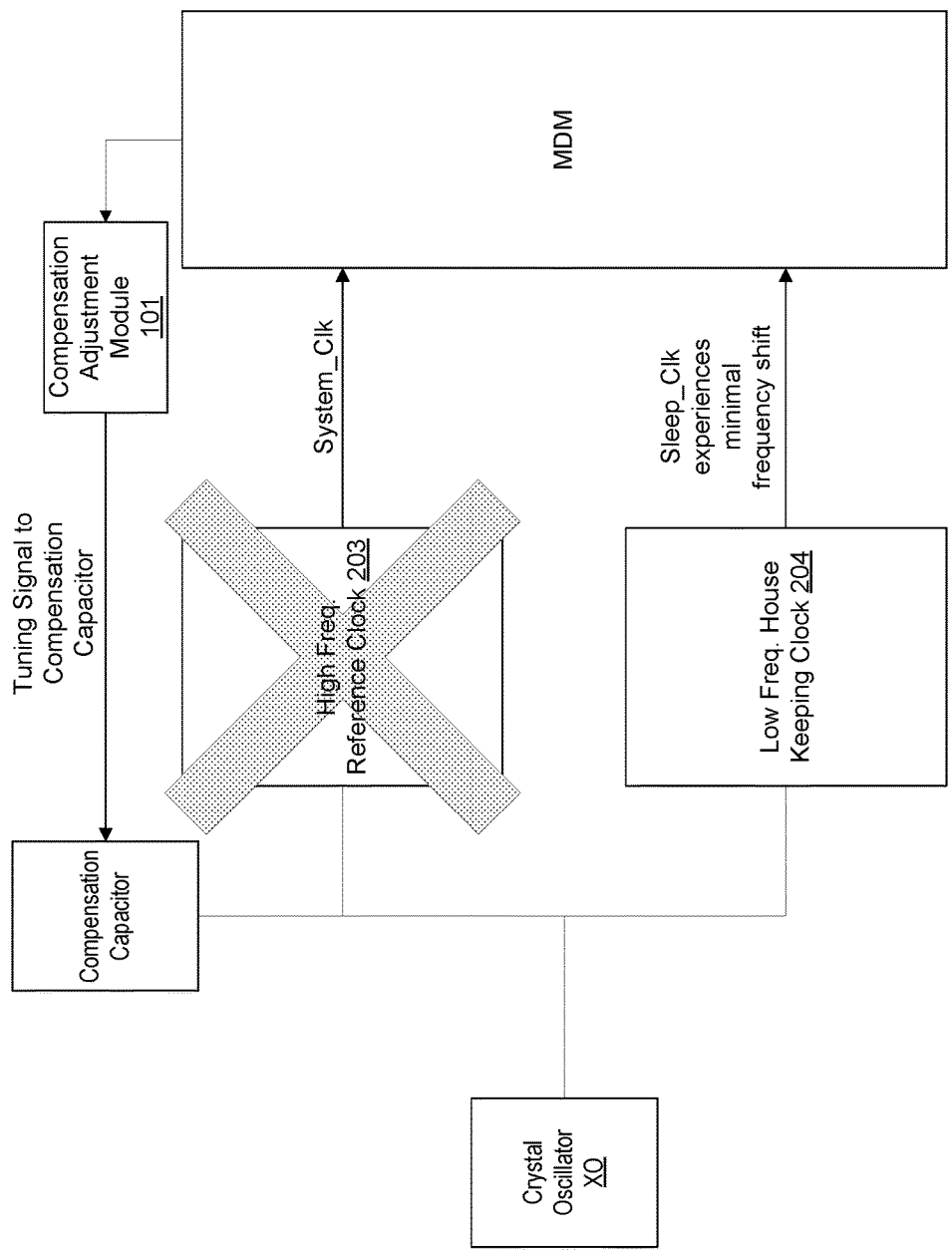
FIG. 5 is a functional block representation of the diagram of FIG. 4 according to an embodiment of the solution, illustrating a sleep mode that includes the high frequency reference clock in an offline state.

FIG. 5 is a functional block representation of the diagram of FIG. 4 according to an embodiment of the solution, illustrating a sleep mode that includes the high frequency reference clock 203 in an offline state. With the reference clock 203 offline due to a power saving mode (as represented by the "X" over reference clock 203 in the illustration), the PMIC 180 may have simultaneously brought compensation capacitor 209 online in order to provide a capacitance load to compensate for the loss of the reference clock 203 load. Because the compensation capacitor 209 may not be set to a capacitance load that closely approximates the lost reference clock 203 load, the embodiment of the solution seeks to adjust the capacitance load generated by the compensation capacitor 209. Recognizing the mode transition of the reference clock 203, the MDM compares the actual sleep clock frequency with the expected frequency. The difference between the actual sleep clock frequency and the expected frequency when the reference clock 203 is offline may be attributable to the setting of the compensation capacitor 209.

The MDM provides the delta, or residue calculation, to the capacitor adjustment module 101 which, in turn, causes the capacitance setting of the compensation capacitor 209 to be adjusted. Advantageously, over the course of multiple iterations in the closed loop control methodology described, embodiments of the solution may adjust the capacitance setting of a compensation capacitor to approximate, or very nearly approximate, a load on the XO that is attributable to an offline reference clock 203. With the compensation capacitor optimally set, components and systems may rely on the accuracy of the sleep clock frequency whether the reference clock is online or not.

Figure 6:
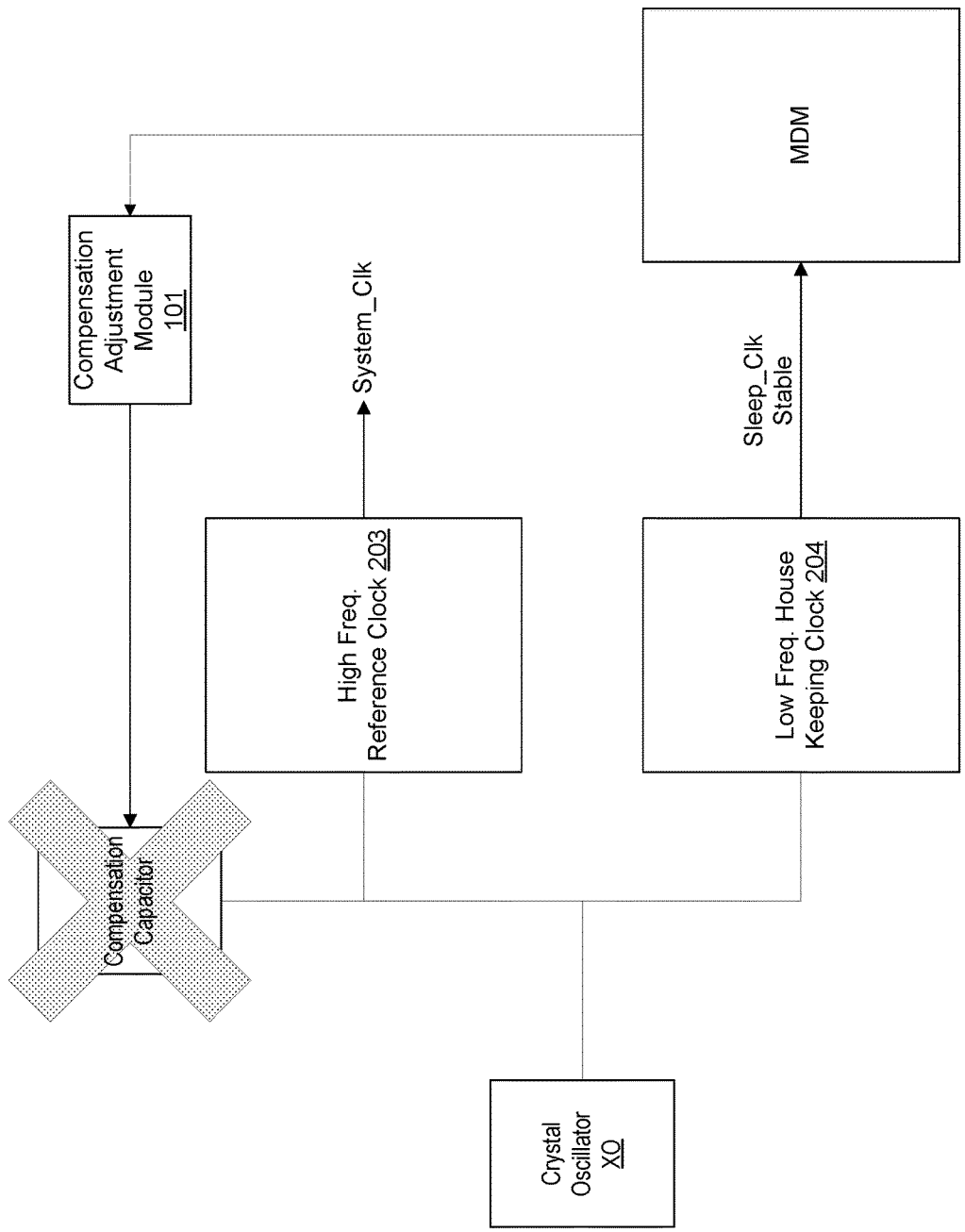
FIG. 6 is a functional block representation of the diagram of FIG. 4 according to an embodiment of the solution, illustrating a turbo mode that includes the high frequency reference clock in an online state.

FIG. 6 is a functional block representation of the diagram of FIG. 4 according to an embodiment of the solution, illustrating a "turbo" mode that includes the high frequency reference clock in an online state. With the reference clock 203 transitioning to an online mode, the MDM may recognize the mode change and make the various calculations described above (or the CAM 101 may make the calculations using data collected by the modem 201 or RPM 202 and provided to the CAM 101). Because the reference clock 203 is online and contributing to the overall load on the XO, the compensation capacitor 209 may be taken offline by the PMIC 180 pending the next mode transition of the reference clock 203.

Figure 7:
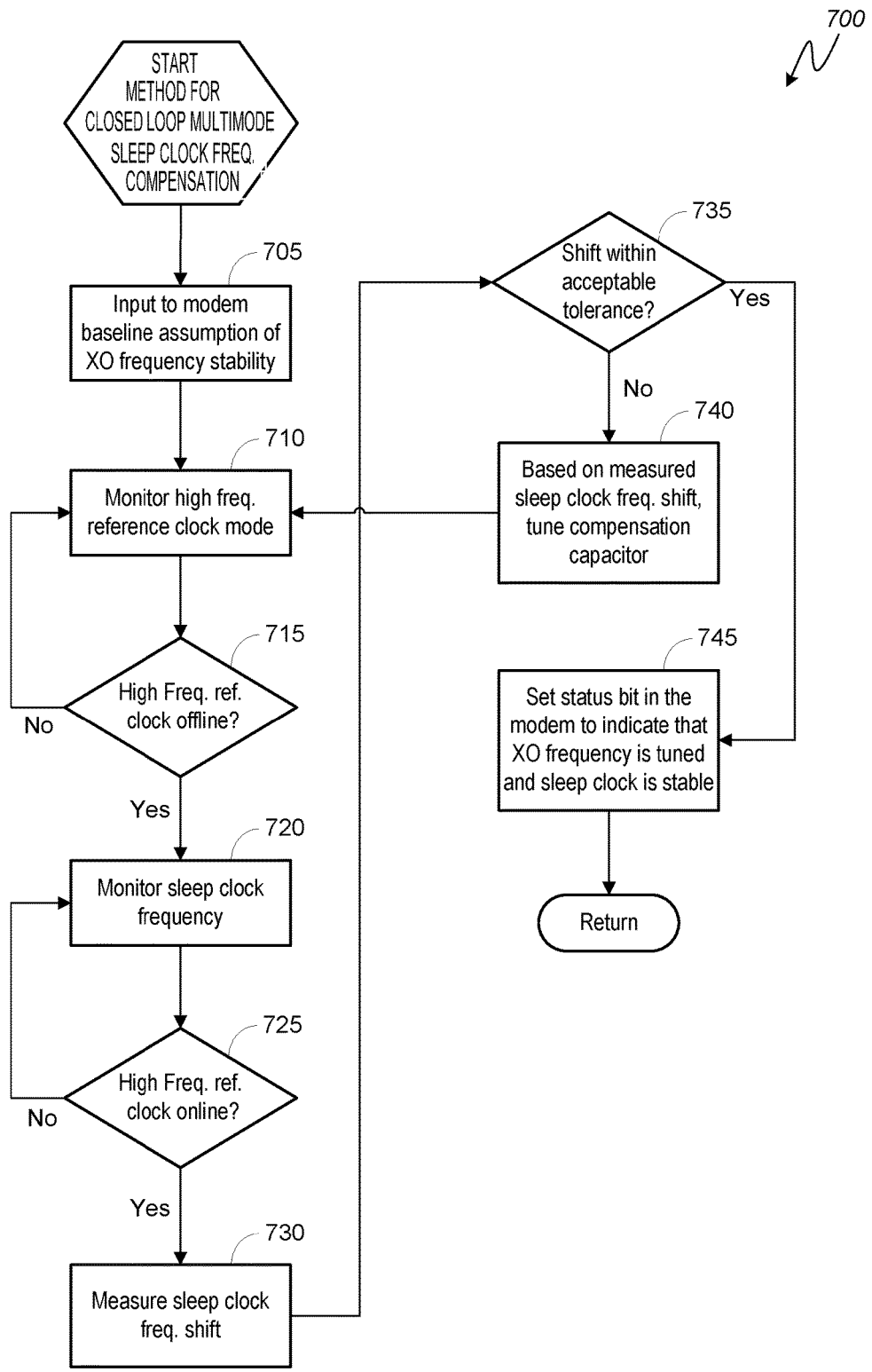
FIG. 7 is a logical flowchart illustrating an exemplary method for closed loop multimode radio system sleep clock frequency compensation according to the solution.

FIG. 7 is a logical flowchart illustrating an exemplary method 700 for closed loop multimode radio system sleep clock frequency compensation according to the solution. Beginning at block 705, the modem 201 (or RPM 202) receives a baseline assumption of the XO frequency stability. Next, at block 710 the mode of the high frequency reference clock is monitored for a transition from an active mode to a sleep or standby mode. At decision block 715, so long as the reference clock 203 remains online, the "no" branch is followed back to block 710 and the monitoring continues. If/when the reference clock 203 is taken offline (perhaps due to a transition to a power saving mode), the "yes" branch is followed from decision block 715 to block 720.

At block 720, the sleep clock frequency is monitored by the modem 201 in anticipation of the reference clock 203 coming back online at some point. Notably, while the reference clock 203 is offline, the compensation capacitor 209 may be providing a dummy load on the XO to compensate for the loss of the reference clock 203 load. At decision block 725, so long as the reference clock 203 stays offline, the "no" branch is followed back to block 720. If/when the reference clock 203 comes back online, the "yes" branch is followed from decision block 725 to block 730.

At block 730, the method 700 may calculate or measure the sleep clock frequency shift based on the expected sleep clock frequency versus the actual sleep clock frequency. Any delta between the expected sleep clock frequency and the actual sleep clock frequency may be attributable to a less than optimal setting on the compensation capacitor 209.

At decision block 735, if the calculated frequency shift is not within an acceptable tolerance range from the expected frequency, the method 700 continues to block 740 and the compensation capacitor 209 setting is adjusted. The method 700 returns to decision block 710 from block 740. The method repeats blocks 710 through 740 until at decision block 735 the calculated frequency shift is found to be within an acceptable tolerance of the expected frequency. At such point, the "yes" branch is followed from decision block 735 to block 745. At block 745, a status bit may be set in the modem 201 or RPM 202 to indicate that the sleep clock frequency has been tuned and is reliable whether the reference clock 203 is online or not. The method 700 returns and may continue to run in the background. For example, it is envisioned that in some embodiments the baseline assumption set in the modem at initial block 705 may be updated with the frequency associated with the status bit set in block 745 so that the method 700 may continue to further tune the compensation capacitor 209 to adjust for changes in the frequency stability of the XO (such as may occur in response to a change in operating temperature of the SoC 102 or ambient temperature to which the SoC 102 is exposed or aging of components in the system, etc.).

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices or software instruction and data structures is not considered necessary for an adequate understanding of how to make and use the invention. The inventive functionality of the claimed computer implemented processes is explained in more detail in the above description and in conjunction with the drawings, which may illustrate various process flows.

In one or more exemplary embodiments, the functions described may be implemented in hardware, software, firmware, or any combination thereof. If implemented in software, the functions may be stored on or transmitted as one or more instructions or code on a computer-readable device. Computer-readable devices include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Therefore, although selected aspects have been illustrated and described in detail, it will be understood that various substitutions and alterations may be made therein without departing from the spirit and scope of the present invention, as defined by the following claims.

What is claimed is:

1. A method for closed loop multimode sleep clock frequency compensation in a portable computing device, the method comprising:

setting a baseline assumption for a crystal oscillator frequency stability, wherein crystal oscillator frequency stability is defined by a range in parts per million relative to zero;

determining that a first reference clock driven by the crystal oscillator has entered a power saving mode;

bringing online a compensation capacitor associated with the crystal oscillator in response to the first reference clock entering the power saving mode, wherein the compensation capacitor provides a capacitance load to replace the load of the first reference clock;

monitoring a sleep clock frequency for a second sleep clock driven by the crystal oscillator;

determining that the first reference clock has transitioned from the power saving mode to an active mode;

calculating a frequency shift associated with the second sleep clock in response to the first reference clock transitioning from the power saving mode to the active mode, wherein the frequency shift is calculated from the difference between a measured sleep clock frequency for the second sleep clock and an expected sleep clock frequency for the second sleep clock; and based on the frequency shift, adjusting the compensation capacitor associated with the crystal oscillator to cancel the frequency shift associated with the second sleep clock.

2. The method of claim 1, further comprising:

determining that the first reference clock has again entered a power saving mode;

bringing online the compensation capacitor associated with the crystal oscillator in response to the first reference clock again entering the power saving mode, wherein the compensation capacitor provides a capacitance load to replace the load of the first reference clock;

monitoring the sleep clock frequency for the second sleep clock;

determining that the first reference clock has again transitioned from the power saving mode to an active mode;

calculating a next frequency shift associated with the second sleep clock in response to the first reference clock transitioning from the power saving mode to the active mode, wherein the next frequency shift is calculated from the difference between a measured sleep clock frequency for the second sleep clock and an expected sleep clock frequency for the second sleep clock; and based on the next frequency shift, adjusting the compensation capacitor to cancel the frequency shift associated with the second sleep clock.

3. The method of claim 1, further comprising setting a status bit to indicate that the sleep clock frequency is stable.

4. The method of claim 1, wherein the crystal oscillator generates a 32 KHz frequency.

5. The method of claim 1, wherein the crystal oscillator generates a 19.2 MHz frequency.

6. The method of claim 1, wherein the frequency shift is calculated by a modem residing on a SoC.

7. The method of claim 1, wherein the compensation capacitor comprises a portion of a bank of capacitors.

8. The method of claim 1, wherein the portable computing device is in the form of a mobile telephone.

9. A system for closed loop multimode sleep clock frequency compensation in a portable computing device, the system comprising:

means for setting a baseline assumption for a crystal oscillator frequency stability, wherein crystal oscillator frequency stability is defined by a range in parts per million relative to zero;

means for determining that a first reference clock driven by the crystal oscillator has entered a power saving mode;

means for bringing online a compensation capacitor associated with the crystal oscillator in response to the first reference clock entering the power saving mode, wherein the compensation capacitor provides a capacitance load to replace the load of the first reference clock;

means for monitoring a sleep clock frequency for a second sleep clock driven by the crystal oscillator;

means for determining that the first reference clock has transitioned from the power saving mode to an active mode;

means for calculating a frequency shift associated with the second sleep clock in response to the first reference clock transitioning from the power saving mode to the active mode, wherein the frequency shift is calculated from the difference between a measured sleep clock frequency for the second sleep clock and an expected sleep clock frequency for the second sleep clock; and based on the frequency shift, means for adjusting the compensation capacitor associated with the crystal oscillator to cancel the frequency shift associated with the second sleep clock.

10. The system of claim 9, further comprising:

means for determining that the first reference clock has again entered a power saving mode;

means for bringing online the compensation capacitor associated with the crystal oscillator in response to the first reference clock again entering the power saving mode, wherein the compensation capacitor provides a capacitance load to replace the load of the first reference clock;

means for monitoring the sleep clock frequency for the second sleep clock;

means for determining that the first reference clock has again transitioned from the power saving mode to an active mode;

means for calculating a next frequency shift associated with the second sleep clock in response to the first reference clock transitioning from the power saving mode to the active mode, wherein the next frequency shift is calculated from the difference between a measured sleep clock frequency for the second sleep clock and an expected sleep clock frequency for the second sleep clock; and based on the next frequency shift, means for adjusting the compensation capacitor to cancel the frequency shift associated with the second sleep clock.

11. The system of claim 9, further comprising means for setting a status bit to indicate that the sleep clock frequency is stable.

12. The system of claim 9, wherein the crystal oscillator generates a 32 KHz frequency.

13. The system of claim 9, wherein the crystal oscillator generates a 19.2 MHz frequency.

14. The system of claim 9, wherein the frequency shift is calculated by a modem residing on a SoC.

15. The system of claim 9, wherein the compensation capacitor comprises a portion of a bank of capacitors.

16. The system of claim 9, wherein the portable computing device is in the form of a mobile telephone.

17. A system for closed loop multimode sleep clock frequency compensation in a portable computing device, the system comprising:

a modem residing on a system on a chip and configured to:

determine that a first reference clock driven by the crystal oscillator has entered a power saving mode;

bring online a compensation capacitor associated with the crystal oscillator in response to the first reference clock entering the power saving mode, wherein the compensation capacitor provides a capacitance load to replace the load of the first reference clock;

monitor a sleep clock frequency for a second sleep clock driven by the crystal oscillator;

determine that the first reference clock has transitioned from the power saving mode to an active mode; and calculate a frequency shift associated with the second sleep clock in response to the first reference clock transitioning from the power saving mode to the active mode, wherein the frequency shift is calculated from the difference between a measured sleep clock frequency for the second sleep clock and an expected sleep clock frequency for the second sleep clock; and a capacitor adjustment module residing on a power management integrated circuit and configured to:

set a baseline assumption for a crystal oscillator frequency stability, wherein crystal oscillator frequency stability is defined by a range in parts per million relative to zero; and based on the frequency shift, adjusting the compensation capacitor associated with the crystal oscillator to cancel the frequency shift associated with the sleep clock.

18. The system of claim 17, wherein:

the modem is further configured to:

determine that the first reference clock has again entered a power saving mode;

bringing online the compensation capacitor associated with the crystal oscillator in response to the first reference clock again entering the power saving mode, wherein the compensation capacitor provides a capacitance load to replace the load of the first reference clock;

monitor the sleep clock frequency for the second sleep clock;

determine that the first reference clock has again transitioned from the power saving mode to an active mode; and calculate a next frequency shift associated with the second sleep clock in response to the first reference clock transitioning from the power saving mode to the active mode, wherein the next frequency shift is calculated from the difference between a measured sleep clock frequency for the second sleep clock and an expected sleep clock frequency for the second sleep clock; and the capacitor adjustment module is further configured to:

based on the next frequency shift, adjust the compensation capacitor to cancel the frequency shift associated with the second sleep clock.

19. The system of claim 17, wherein the modem is further configured to:

set a status bit to indicate that the sleep clock frequency is stable.

20. The system of claim 17, wherein the crystal oscillator generates a 32 KHz frequency.

21. The system of claim 17, wherein the crystal oscillator generates a 19.2 MHz frequency.

22. The system of claim 17, wherein the frequency shift is calculated by a modem residing on a SoC.

23. The system of claim 17, wherein the compensation capacitor comprises a portion of a bank of capacitors.

24. A computer program product comprising a computer usable device having a computer readable program code embodied therein, said computer readable program code adapted to be executed to implement a method for closed loop multimode sleep clock frequency compensation in a portable computing device, said method comprising:

setting a baseline assumption for a crystal oscillator frequency stability, wherein crystal oscillator frequency stability is defined by a range in parts per million relative to zero;

determining that a first reference clock driven by the crystal oscillator has entered a power saving mode;

bringing online a compensation capacitor associated with the crystal oscillator in response to the first reference clock entering the power saving mode, wherein the compensation capacitor provides a capacitance load to replace the load of the first reference clock; 0042, 0044 monitoring a sleep clock frequency for a second sleep clock driven by the crystal oscillator;

determining that the first reference clock has transitioned from the power saving mode to an active mode;

calculating a frequency shift associated with the second sleep clock in response to the first reference clock transitioning from the power saving mode to the active mode, wherein the frequency shift is calculated from the difference between a measured sleep clock frequency for the second sleep clock and an expected sleep clock frequency for the second sleep clock; and based on the frequency shift, adjusting the compensation capacitor associated with the crystal oscillator to cancel the frequency shift associated with the second sleep clock.

25. The computer program product of claim 24, the method further comprising:

determining that the first reference clock has again entered a power saving mode;

bringing online the compensation capacitor associated with the crystal oscillator in response to the first reference clock again entering the power saving mode, wherein the compensation capacitor provides a capacitance load to replace the load of the first reference clock;

monitoring the sleep clock frequency for the second sleep clock;

determining that the first reference clock has again transitioned from the power saving mode to an active mode;

calculating a next frequency shift associated with the second sleep clock in response to the first reference clock transitioning from the power saving mode to the active mode, wherein the next frequency shift is calculated from the difference between a measured sleep clock frequency for the second sleep clock and an expected sleep clock frequency for the second sleep clock; and based on the next frequency shift, adjusting the compensation capacitor to cancel the frequency shift associated with the second sleep clock.

26. The computer program product of claim 24, further comprising setting a status bit to indicate that the sleep clock frequency is stable.

27. The computer program product of claim 24, wherein the crystal oscillator generates a 32 KHz frequency.

28. The computer program product of claim 24, wherein the crystal oscillator generates a 19.2 MHz frequency.

29. The computer program product of claim 24, wherein the frequency shift is calculated by a modem residing on a SoC.

30. The computer program product of claim 24, wherein the compensation capacitor comprises a portion of a bank of capacitors.

* * * * *